(12) United States Patent
Bezama et al.

(10) Patent No.: US 8,107,800 B2
(45) Date of Patent: Jan. 31, 2012

(54) METHOD AND STRUCTURE TO CONTROL THERMAL GRADIENTS IN SEMICONDUCTOR WAFERS DURING RAPID THERMAL PROCESSING

(75) Inventors: Raschid J. Bezama, Mahopac, NY (US); Lewis S. Goldmann, Bedford, NY (US); Donald R. Wall, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 963 days.

(21) Appl. No.: 11/970,693

(22) Filed: Jan. 8, 2008

(65) Prior Publication Data

US 2009/0175606 A1     Jul. 9, 2009

(51) Int. Cl.
*F26B 19/00* (2006.01)
(52) U.S. Cl. ............................ 392/418; 392/407; 392/416
(58) Field of Classification Search .................... 392/418
See application file for complete search history.

(56) References Cited

U.S. PATENT DOCUMENTS

| | | | |
|---|---|---|---|
| 5,487,127 A * | 1/1996 | Gronet et al. .................. | 392/416 |
| 5,871,588 A | 2/1999 | Moslehi et al. | |
| 6,046,439 A | 4/2000 | Johnsgard et al. | |
| 6,062,852 A * | 5/2000 | Kawamoto et al. ............ | 432/258 |
| 6,188,044 B1 | 2/2001 | Lee et al. | |
| 6,343,183 B1 | 1/2002 | Halpin et al. | |
| 6,345,150 B1 * | 2/2002 | Yoo ............................... | 392/418 |
| 6,399,921 B1 | 6/2002 | Johnsgard et al. | |
| 6,768,084 B2 | 7/2004 | Liu et al. | |
| 7,112,763 B2 * | 9/2006 | Hunter et al. .................. | 219/411 |
| 7,127,367 B2 | 10/2006 | Ramachandran et al. | |

* cited by examiner

*Primary Examiner* — Thor Campbell
(74) *Attorney, Agent, or Firm* — Ian D. MacKinnon

(57) ABSTRACT

An article supports a workpiece during thermal processing. At least three elongated support members, e.g., support pins, extend upwardly from an element such as support arms for supporting the workpiece. Each of the support members includes a first portion adjacent to the workpiece. A second portion extends downwardly from the first portion. The first portion can have a thermal response faster than the thermal response of the workpiece and the second portion can have a slower thermal response. A removable element may be mounted to the support member for adjusting the thermal response of the support member. With removable elements, the support members can be adjusted to cause no net transfer of heat to or from the workpiece.

6 Claims, 2 Drawing Sheets

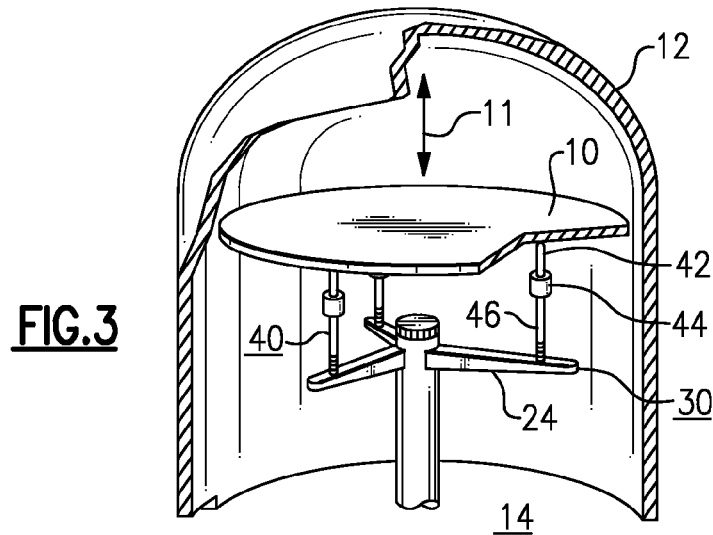
FIG. 3
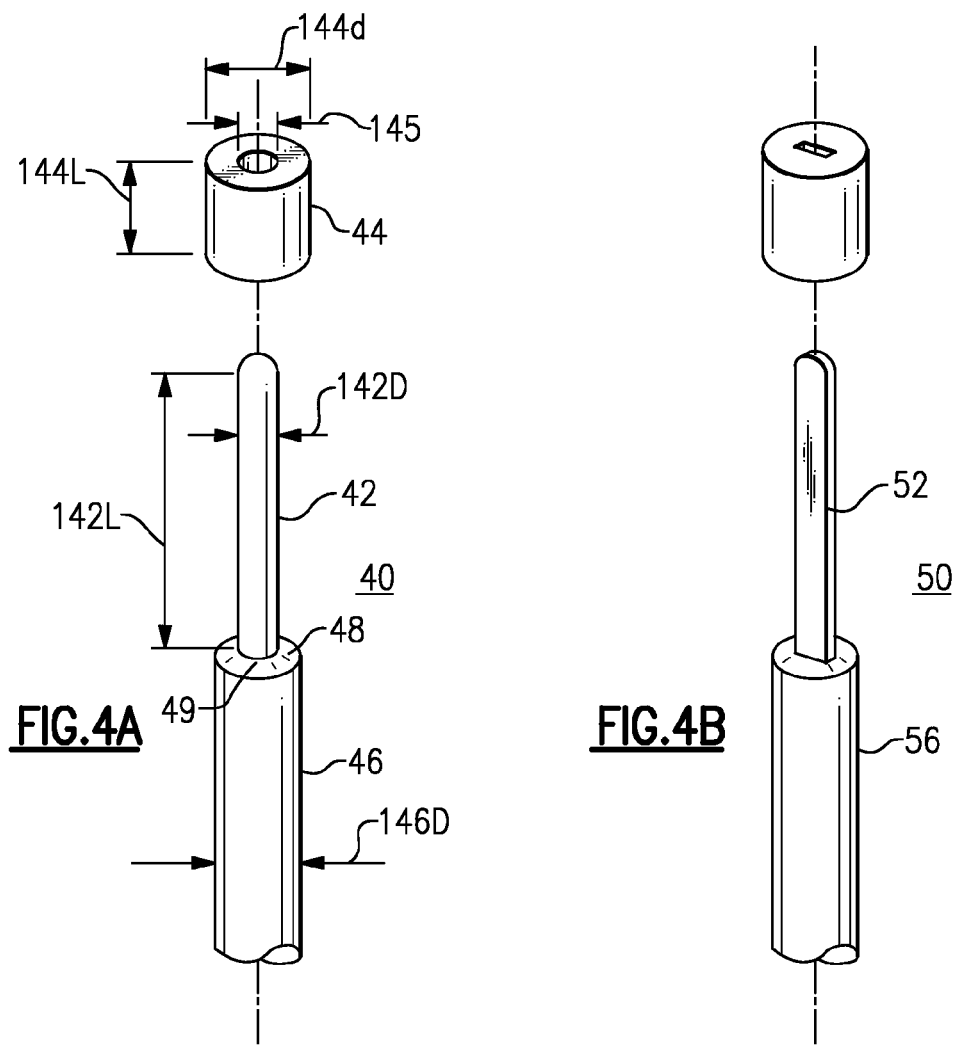
FIG. 4A
FIG. 4B

METHOD AND STRUCTURE TO CONTROL THERMAL GRADIENTS IN SEMICONDUCTOR WAFERS DURING RAPID THERMAL PROCESSING

BACKGROUND OF THE INVENTION

1. Field of the Invention

The embodiments of the invention generally relate to a system and method for controlling thermal gradients in a silicon wafer during thermal processing.

2. Description of the Related Art

While the use of high temperature ovens for thermal processing of wafers to manufacture advanced integrated circuit chips have been in use for the past few decades or so, the use of rapid thermal processing and the requirement to control the wafer temperature gradients at the process peak temperature within a continuously decreasing processing window is a more recent development, mostly driven by the continuous reduction in the dimensions of the electronic transistors being fabricated in the wafer surface. Economic forces drive both the need to increase function integration within each silicon die and the need to develop new technologies to increase the processing capability of each die in a continuous effort to reduce the die unit cost. As the size of transistors being built on the surface of a silicon wafer decrease well under submicron dimensions the need for fast wafer thermal processing continues and the need for tighter control increases. One particular example of this is the junction anneal where fast thermal processing allows the process to balance the need for thermally activating dopant atoms in the silicon wafer with the need to minimize and optimize the diffusion of the dopant atoms near the channel and the gate.

Rapid thermal processing of silicon wafers is typically done in tools that process one wafer at the time to facilitate wafer heating and cooling through both of the silicon main surface areas. Single wafer processing also facilitates the effort required to control the wafer temperature gradients. However, faster heating ramp rates increase the difficulties to maintain uniform temperature distribution over the functional wafer surface at the desired peak processing temperature of interest. For practical purposes, the wafer thermal gradients can be separated into global thermal gradients and local thermal gradients. Global thermal gradients are dependent mostly on one geometric axis and typically affect the whole wafer, such as, for example radial or axial thermal gradients. Local thermal gradients usually affect only a fraction of the wafer. To facilitate the thermal control over the whole wafer, most of the ovens use heating elements that provide heat flux with angular symmetry relative to the wafer center axis. Since the wafer has more surface/volume ratio at the perimeter most furnace manufacturers provide some capability to tune the heat flux radially and the angular dependency is controlled by either rotating the wafer or with the use of angularly independent heating elements. In some cases, the wafer radial thermal gradient is minimized with the use of a thermal ring around the wafer periphery, as described in U.S. Pat. No. 7,127,367 to Ramachandran et al. This ring is designed to heat and cool at a prescribed rate to control the wafer thermal radial gradients. Radially dependent thermal gradients, with low or no angular dependency are usually caused by the interaction between a radially dependent radiative heat flux provided by the furnace and a radially dependent thermal coupling between the wafer and its surroundings. This type of global thermal gradient, which has an effect on the whole wafer, cannot be resolved by wafer rotation. Another type of global thermal gradient, known as an "axial" gradient, is dependent upon the depth within the wafer in an axial direction of the wafer. Global axial thermal gradients, i.e. axial gradients which are not radially dependent, are usually controlled by rebalancing the radiative energy distribution in the furnace above and below the wafer.

Local thermal gradients within the wafer can be caused by the thermal interaction between the wafer and a support structure used to position the wafer in the oven. Local thermal gradients are usually controlled with the use of open support structures which are designed to present very little obstruction to radiative energy emitted from the internal walls of the oven or processing chamber. For example, as illustrated in FIG. 1, a wafer 10 can be maintained in position during such processing by force of its weight upon a structure 20 having support pins 22 made with materials which have low thermal conductivity like quartz, fused silica, or other material compatible with the process used to treat the silicon wafer. In many tools, fused silica is the material of choice for the fabrication of these support pins because this material has both low thermal conductivity and low thermal expansion coefficient. The low thermal conductivity reduces the thermal coupling between the wafer and the support pins, thus enabling a thermal control capable of maintaining the wafer temperature within a 10° C. thermal window in processes that require heating the wafer to a temperature peak above 1000° C. In parallel, the low thermal expansion coefficient of fused silica is similar to the thermal coefficient of the silicon wafer and results in minimal lateral displacements between the support pins and the wafer during thermal processing to high temperature. Lateral displacements of contact points in the back side of the wafer can create micron size cracks on the wafer bottom surface which can later grow with further thermal treatments and precipitate unacceptable wafer damage and even catastrophic breaking of wafers.

In a conventional arrangement for processing, the wafer is suspended inside an oven 14 using a wafer transport mechanism that holds the wafer using at least three long pins 22, as shown schematically in FIG. 1. The length of each support pin typically is kept in a range of 20 to 80 mm to allow sufficient distance between the wafer and the support structure, thus reducing the exchange of radiative energy between these two objects, while simultaneously increasing the exchange of radiative energy between the bottom surface 28 of the wafer 10 and the oven 14. The structure used to hold the pins that support the wafer is usually too massive to heat and cool at a fast rate and it is expected to remain significantly cooler than the wafer at all times. The diameter of the fused silica pins is kept at or above 1.8 mm, depending on the pin length, to provide a pin with sufficient strength so that a set of three pins can support a 300 mm wafer.

But with the development of new processes with short peak temperature soaks usually shorter than a few seconds, fast ramp rates typically around −25-300° C./second, and continuously shrinking complex structures to create new and more powerful transistor devices, the existing thermal processing window of 10° C. with a peak processing temperature, well above 1000° C., is not sufficient to generate wafers with acceptable yields. This type of rapid thermal processing can be done by moving the wafer inside the oven from a zone of the oven at comparatively low temperature into another zone of the oven at a higher temperature. The oven temperature profile is kept constant at a prescribed temperature distribution. (See, for example U.S. Pat. No. 6,768,084 to Liu et al.)

A typical wafer temperature distribution in a high temperature fast junction anneal process, depicted in FIG. 2, shows the deficiencies of the existing rapid thermal processing technology. Advances in wafer peak temperature characterization allow the precise determination of wafer functional surface temperature to a level better than one degree Celsius. The data thus collected shows that the wafer peak temperature distribution is lower on the regions of the wafer that surround the point where the support pins contact the wafer and do not meet the new requirements to be within a 2° C. thermal window. The data illustrates the shortcomings of the existing rapid processing tools to deliver adequate process temperature control within the wafer surface. The resulting distribution of temperatures within the wafer is also dependent on the radiative properties of the front and rear surfaces of the wafer. As it can be demonstrated that the radiative properties of the wafer are dependent upon the type of structures present at the front (functional) surface of the wafer, it is apparent that different wafers can have temperature distributions which exhibit significant differences due to differences between the structures being fabricated on each wafer.

During thermal processing the wafer interacts strongly with some of the oven internal elements. These interacting elements are shown partially in FIG. 1 and include the silicon wafer 10, the internal heated wall 12 of the oven 14, and the wafer support structure 20. As depicted in FIG. 1, a section of the wafer 10 has been cut away in order to show a location 26 where one of the support pins 22 contacts the wafer 10. While the support structure 20 has many different components, only two of these components are shown here, namely the wafer support pins 22 and the pin holder arms 24. The support pins support the weight of the wafer in a position sufficiently to avoid the wafer from tipping. For ease of illustration, other components of the oven such as heating elements, a thermal ring around the wafer, inlet and outlet gas lines, and external infrastructure are not shown in FIG. 1. While radiative energy exchange is the dominant heat transfer mechanism between all the components described above, heat conduction inside the wafer 10 and each support pin 22 are also important. Some of these other components may also participate on the radiative process that determines the wafer thermal response, but their importance is mostly related to wafer global thermal gradients.

While there are many different thermal profiles that are used in a rapid thermal processing tool, the majority of the processes do involve a preheat ramp to a preset intermediate temperature, a short soak at the intermediate temperature, a fast ramp to the process peak temperature, a prescribed soak time of 0-10 min, and a fast cooling ramp. Since the overall process is done rapidly, the oven must be kept at a relatively constant temperature profile to provide a controlled distribution of radiative energy in the oven hot zone. The preheat ramp and short temperature soak are needed to bring the wafer to an intermediate temperature where the radiative energy transport is the dominant heat transfer mechanism. The soak is needed to let the wafer temperature equilibrate sufficiently to facilitate the required thermal control at the process peak temperature. The wafer fast temperature ramp to the process peak temperature can be done by moving the wafer at a fast and controlled displacement rate between a zone of the oven where it is maintained during the soak and another zone of the oven where the wafer reaches the peak temperature. Both the wafer 10 and the support pins 22 are expected to heat up at similar heating rates, but the rest of the support structure 20, including the pin holder arms 24 do not heat up significantly in the short processing time, mainly because of their significantly larger thermal mass.

The shortcomings of the existing technology are shown by profiling the wafer temperature in a path that goes over the area where the wafer 10 contacts the support pin 22. An example of such temperature distribution is depicted in FIG. 2. The line "DT-w" in FIG. 2 depicts wafer temperatures observed via measurements during a rapid thermal processing ("RTP") process, such temperatures being observed via measurements of resistance at various points along the front (active) surface of the wafer. The line DT-w indicates the wafer functional surface temperature at the point opposite to the support pin contact point to be about 10° C. cooler than the wafer average temperature. This line also shows the cooling effect from the pin to affect an area of approximately 30 mm in diameter around this contact point. In those areas of the wafer surrounding a support pin 22, the presence of a thermally coupled support pin 22 effectively modifies the transient thermal response of the wafer relative to changes in radiative conditions.

It bears noting that not all the length of the support pin 22 is thermally coupled to the wafer. Only a portion of the length at the top of the pin that is proportional to the support pin 22 thermal conductivity is capable of interacting with the wafer. Since the thermal conductivity of fused silica is the lowest relative to the conductivity of other materials also used in these types of applications, like silicon, silicon carbide or quartz itself, it is understandable that no thermal solutions are possible to minimize the local thermal gradient created by the existing tooling.

SUMMARY OF THE INVENTION

In accordance with an aspect of the invention, an article is provided for supporting a workpiece during thermal processing. A first element of the article, e.g., support arms or other structure is adapted to support a weight of the workpiece. At least three elongated support members, e.g., support pins, extend upwardly from the first element for supporting the workpiece above the first element. Each of the support members includes a first portion adjacent to the workpiece. The first portion can have a first thermal response faster than a thermal response of the workpiece. A second portion of each support member extends downwardly from the first portion. The second portion can have a second thermal response which is slower than the thermal response of the workpiece.

A method of thermally processing a workpiece is provided in accordance with another aspect of the invention. In such method, the workpiece is supported within a chamber by at least three upwardly extending elongated support members. Each of the support members includes a first portion adjacent to the workpiece. The first portion can have a first thermal response which is faster than a thermal response of the workpiece. A second portion extends downwardly from the first portion. The second portion can have a second thermal response which is slower than or equal to the thermal response of the workpiece. Heat is transferred to or from the workpiece. When a temperature of the first portion of each support member changes at least as rapidly as the workpiece, there is no net flow of heat from the workpiece into the support members.

BRIEF DESCRIPTION OF THE DRAWINGS

The embodiments of the invention will be better understood from the following detailed description with reference to the drawings, in which:

FIG. 3 is a schematic illustration of the interior of a rapid processing tool with a wafer and a support structure that uses support pins in accordance with a first embodiment of the invention;

FIG. 4A is a perspective view illustrating a support pin structure in accordance with an embodiment of the invention; and FIG. 4B is a perspective view illustrating a support pin structure in accordance with another embodiment of the invention.

DETAILED DESCRIPTION OF PREFERRED EMBODIMENTS

Figure 1:
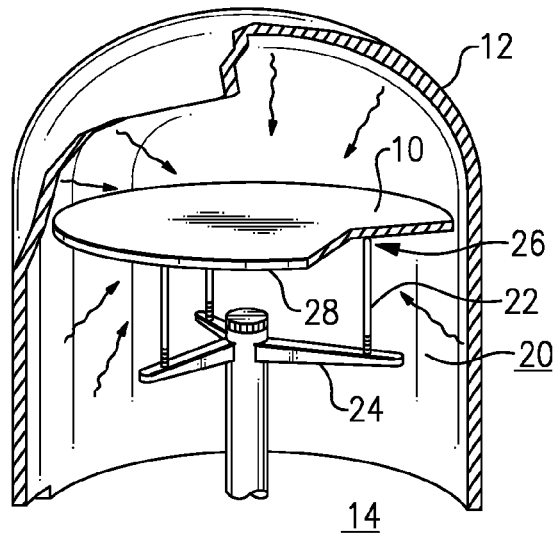
FIG. 1 is a cutaway perspective view illustrating an interior of a rapid processing tool according to the prior art and further illustrating a wafer and support structure for the wafer therein.

Based on the foregoing discussion, there is a need for a structure and method to minimize the thermal local gradients in the wafer regions around the wafer regions where the wafer is in contact with the support pins. In addressing the problems described in the foregoing, the inventors have determined that a solution which resolves the temperature gradient around the support contact point should also allow the thermal response of the assembly to be adjusted for different wafer types without the need to modify the oven thermal profile. Profile adjustments to accommodate different wafer types are not desired because they drive significant time overhead and reduce the tool overall throughput. The inventors further recognize the desirability and need for a structure and method that permits fine tuning of the wafer temperature around the support pins to accommodate the processing of wafers of different types and through various recipes.

The embodiments of the invention and the various features and advantageous details thereof are explained more fully with reference to the non-limiting embodiments that are illustrated in the accompanying drawings and detailed herein. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

The inventors have studied transient temperature distribution inside the wafer 10 and support pin 22 system using commercially available simulation software with the object to understand the sensitivity of the wafer thermal profile at the process peak temperature to variability in process conditions, support pin 22 and wafer thermal properties, and support pin 22 tip geometry. As in the above-described chamber, the temperature within the chamber 12 varies with position along an axial direction 11 of movement up or down therein. In a typical manufacturing environment, all these parameters can and will change by a relatively small amount around a preset value, usually controlled by an engineering specification. The simulated wafer temperature distributions obtained for some of the key process parameters are illustrated by the lines indicated in FIG. 2 as dT-m1, dT-m2 and dT-m3. The close agreement between the simulations and the experimental data (line dT-w) confirm that the dip in the wafer's temperature in the area where the support pins 22 contacts the wafer 10 is driven by the fact that the support pins 22 are cooler than the wafer 10 at the peak temperature by a large temperature delta.

This suggests that the support pin thermal mass is somewhat larger than the wafer thermal mass in the neighborhood of contact point 26. Hence, the thermal time constant for the support pin is also larger than the thermal time constant for the wafer 10, since the time constant of a system is proportional to its thermal mass and the wafer 10 and support pin 22 are exposed to the same radiative energy flux on the wafer 10 bottom side. But reducing the diameter of support pin 22 to reduce its thermal time constant is not feasible because the strength of the pin is reduced faster than the thermal time constant relative to a given change in pin diameter.

Referring now to FIGS. 3 and 4A, the shortcomings of the existing technology are resolved with the use of a composite support pin 40, a first embodiment of this invention, which comprises three elements, namely a pin upper section 42 which contacts the wafer 10, a pin lower section 46 which is secured over support structure 24, and thermal lag ring 44. As depicted in FIG. 4A, the upper section 42 may extend from an end surface 48 of the lower section, such that a portion of the end surface extending beyond the diameter of the upper section defines a ledge 49.

In this embodiment all three elements have cylindrical shape. The pin upper section may include or consist essentially of fused silica or quartz or may include or consist essentially of a material significantly stronger than fused silica, such as silicon carbide. Silicon carbide has significantly greater thermal conductivity than either quartz or fused silica, with that of quartz falling between silicon carbide and fused silica. When the upper section of the pin consists essentially of silicon carbide, the greater thermal conductivity of silicon carbide favors making the diameter of the upper section significantly smaller than the lower section to achieve the correct thermal response. The diameter 142 of the upper section 42 is selected to fall within a range that delivers a thermal response which is faster than the thermal response of the wafer 10. To provide for such result, given the thermal conductivity of the material of which the upper section is made, its cross-sectional geometry and surface area, the diameter of the upper section is selected such that a thermal time constant of the upper section is smaller than the thermal time constant of the wafer 10. Stated another way, the rate at which heat is transferred in a lengthwise direction of the upper section must be faster than the transfer rate of heat in an axial (top to bottom) direction of the wafer where the support pin contacts the wafer.

By selecting the pin upper section 42 diameter in this manner, we effectively take into account the selection of material thermal properties and oven thermal environment; hence no restriction is needed for the material of the upper section based on individual factors of its thermal conductivity, density, heat capacity, and radiative properties. The length of the pin upper section should be selected according to the material thermal conductivity and strength. It may be desirable to make the length of the upper section at least of five times the diameter of the upper section for low thermal conductivity materials like fused silica. The actual length of the pin upper section 42 must be set to enable weak thermal coupling between the wafer 10 and the composite support pin 40 lower section 46. Depending upon the geometry and dimensions of the upper section, if the upper section is made particularly small in relation to its length, the upper section can include or consist essentially of silicon carbide, since that material exhibits greater resistance to shear stresses than fused silica.

The pin lower section 46 can be made of any material suitable for use inside the oven, like fused silica, quartz, or silicon carbide. However, the diameter should be selected to a range that delivers a thermal time constant that is equal or larger than the thermal constant of the wafer 10. Stated another way, the thermal response of the lower section 46 should be at the same rate or slower than the thermal response of the workpiece. While there are no restrictions relative to the length and diameter of this section of a support pin 40, the length is selected to match the difference between the required total pin 40 length and the selected length of pin upper section 42. But the pin lower section 46 minimum diameter is defined by the material strength and the need to support a 300 mm wafer or the need to match the wafer 10 thermal constant, whichever is larger.

FIGS. 3 and 4A further depict a thermal lag ring 44, typically a short cylinder with inside diameter sized to accommodate the pin upper section 42. The lag rings can be removable elements. The lag rings can be made to fit over the ends of the upper sections of the pins and may be slidable in a direction of the length of the pins. The inside diameter 145 of the lag ring may be between the diameter 142D of the upper section and the diameter 146D of the lower section such that the lag ring can rest securely on the ledge 49 provided at the end surface 48 of the lower section. The thermal response of the lag ring can be different from the thermal response of the upper section of the support pin, the lower section or both.

Like the support pins, for processing of silicon wafers at least moderate temperatures, the lag rings can consist essentially of one or more materials which do not affect the processing of wafers within the chamber, such as quartz or fused silica forms of silicon dioxide and silicon carbide. The outside diameter of this element is selected to be equal or larger than the diameter of pin lower section 46. The length 144L of this element is selected to be approximately a simple fraction of the length 142L of pin upper section 42, like for example ¼ or ⅕ of the length 142L. In some cases both sections of the composite pin and/or thermal lag element can be made from the same material. Further, both upper and lower sections can be machined from a single piece of material or made separately and then fused together. If the upper and lower sections are made from different materials or from separate pieces with different diameter, then any conventional way can be used to join both pieces to form the composite pin 40 described above. By adding thermal lag rings to the pin upper section, the transient response of the pin upper section can be modified. When designed properly, a long pin upper section should heat a bit faster than the wafer and overheat by a prescribed temperature difference. If the pin upper section is sufficiently long, then the lower temperature of the pin bottom section will not interact with the pin upper section tip and the wafer will show a positive temperature spike around the pin, i.e. the wafer temperature around the pin will have a temperature hot spot. By shortening the length of freely exposed upper pin length using the thermal lag rings, the magnitude of a hot spot at the wafer surface opposite the pin can be effectively reduced until it becomes a temperature cold spot. This behavior has been verified using numerical simulation to determine the range of operation where the thermal lag rings are most effective.

In some situations, it can also be advantageous to use non-cylindrical shapes to build the pin upper section. A particularly advantageous shape for the upper section is to use a flat plate 52 with round tip, as shown in FIG. 4B as part of pin 50. This type of pin can be mounted over the pin lower section 56 to be oriented radially relative to the wafer 10 center, mainly to minimize interference to the radiative exchange of energy between the wafer and the oven heated walls and also to provide better mechanical resistance to radial movements. A flat plate can be made thinner than a cylindrical pin while keeping the same strength to support a given wafer. The thermal time constant of a flat plate is strongly dependent on the plate thickness and weakly dependent on the plate width. The plate round tip is needed to minimize the contact area between the wafer and the plate to a minimum value and in similar range as the contact area on the tip of a round pin. Again, the same functionality described before for the cylindrical composite pin 40 (FIG. 4A) can be accommodated in a plate type pin by machining thermal lag elements to match the shape of this type of pin. In yet another variation, the pin upper section can be cylindrical in shape on one side but have a flat exposed side opposite the cylindrical side.

In another variation, the pin upper section, lower section or both can be prismatic in shape, i.e., having triangular cross-section. In such case, the section of the support pin has three flat sides which extend in a direction of the length of the support pins.

In yet another variation, the pin upper section, the lower section, or the lag ring, or a combination thereof, can be frusto-conical in shape. For example, the diameter of the pin upper section may increase in a downward direction extending away from the wafer surface. The increase in upper section diameter may be monotonic or not monotonic, e.g., stepped. Likewise, the lower section or the lag ring may have such shape.

In order to adjust for various processing at various temperatures, a collection of thermal lag rings can be provided which have different thermal responses. For example, the lag rings may have different diameters, lengths or both, or have different material compositions or be different by a combination of such variables. Lag rings can be selected from such collection based on the particular temperatures at which thermal processing is to be performed and the selected lag rings 44 (FIG. 3) can then be removably mounted to the support pins 40 of the structure before performing such processing.

EXAMPLES

Examples shown in this section are predominantly obtained from model results. They show the agreement between the model prediction and the expectation flowing from the theory presented and description of the invention. However, actual wafer data is included in FIG. 2 for the purpose of validating the accuracy of the model and also calibrating the model against the unknown initial pin temperature.

Figure 2:
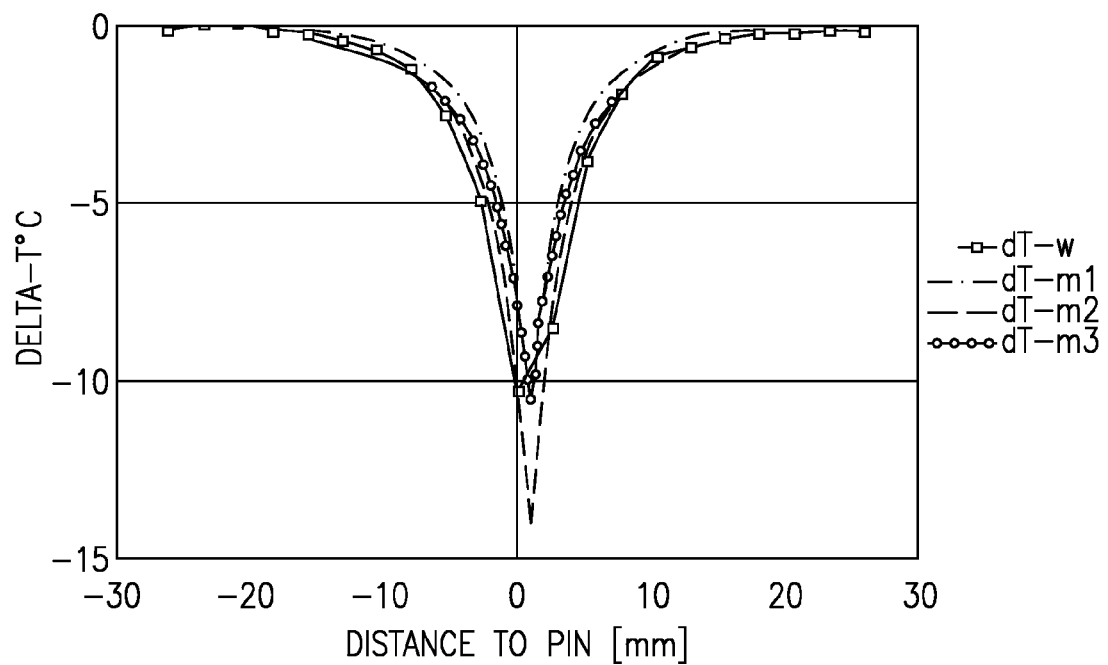
FIG. 2 is a plot showing the measured temperature of a wafer functional surface on a path that traverses the area where the wafer is in contact with a support pin.

In Table 1 and FIG. 2 is shown the effect of initial pin temperature. This parameter will effect the local temperature distribution in the wafer as the wafer is supported by the pin and heated. However, this parameter is also difficult to measure directly. By comparing model expectation as a function of initial pin temperature against actual wafer data, it is possible to obtain an engineering estimate of the initial pin temperature by selecting the condition which most closely matches actual experience. This is done in FIG. 2. It can also been seen from FIG. 2 that the relative behavior of the model prediction is in good agreement with actual data and that parametric changes that either increase or decrease the time constant of the pin have the expected impact in wafer temperature.

In Table 1, model results are shown where the effective tuning ability of a lag ring is clearly illustrated. As the free pin length is reduced by adding additional lag rings, the time constant of the upper portion of the support structure is proportionally increased relative to the wafer such that the local wafer temperature is reduced. In this way one can migrate from a hot spot to a cold spot in the wafer, or more particularly one can easily tune a support structure for any given recipe to provide the minimum local temperature gradient in the wafer.

Table 1. Model results showing the effective tuning utility of a lag ring. In all cases the pin diameter was 2.0 mm and the profile ramp rate in the wafer was 110 C/s to a peak temperature above 1000° C., with initial temperature of 770° C.

| Wafer dT Modified and Tuned With the use of Lag Rings | | | | |
|---|---|---|---|---|
| Free Pin Length | 10 mm | 15 mm | 20 mm | 30 mm |
| Max dT in the wafer | −7.2 C. | −1.5 C. | +1.6 C. | +3.6 C. |

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that these embodiments can be practiced with modification within the spirit and scope of the appended claims.

The foregoing descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications. It is also understood, by those skilled in the art, that some of the modifications to the wafer support hardware here also apply to other wafer processing steps which additionally include changes in wafer temperature.

While the invention has been described in accordance with certain preferred embodiments thereof, many modifications and enhancements can be made thereto without departing from the true scope and spirit of the invention, which is limited only by the claims appended below.

What is claimed is:

1. An article for supporting a workpiece during thermal processing, comprising:
    a first element adapted to support a weight of the workpiece, wherein the workpiece consists essentially of silicon; and
    at least three elongated support members extending upwardly from the first element for supporting the workpiece above the first element, each of the support members including a (i) first portion adjacent to the workpiece, the first portion having a first thermal response faster than a thermal response of the workpiece, and (ii) a second portion extending downwardly from the first portion, the second portion having a second thermal response slower than the thermal response of the workpiece, wherein the support members consist essentially of at least one material selected from the group consisting of quartz, fused silica and silicon carbide,
    the article further comprising elements removably mountable above the second portions of the support members, the elements having a third thermal response slower than the first thermal response.

2. The article as claimed in claim 1, wherein the removably mountable elements are slidable along the first portions of the support members.

3. An article for supporting a workpiece during thermal processing, comprising:
    a first element adapted to support a weight of the workpiece; and
    at least three elongated support members extending upwardly from the first element for supporting the workpiece above the first element, each of the support members including a (i) first portion adjacent to the workpiece, the first portion having a first thermal response faster than a thermal response of the workpiece, and (ii) a second portion extending downwardly from the first portion, the second portion having a second thermal response slower than the thermal response of the workpiece, wherein the first and second portions of each support member have respective first and second cross-sectional areas in a direction transverse to a length of each support member, wherein the second cross-sectional area is greater than the first cross-sectional area, and wherein the first portion of each support member extends from an end surface of the second portion and a portion of the end surface exposed beyond the first portion defines a ledge, further comprising elements removably mountable atop the ledges of the support members, the removably mountable element having a third thermal response slower than the first thermal response.

4. The article as claimed in claim 2, wherein the removably mountable element includes an opening sized to accommodate at least some of the first portion.

5. An article for supporting a workpiece during thermal processing, comprising:
    a first element adapted to support a weight of the workpiece; and
    at least three elongated pins extending upwardly from the first element for supporting the workpiece above the first element, each of the pins including a (i) first portion adjacent to the workpiece, the first portion having a first thermal response faster than a thermal response of the workpiece, and (ii) a second portion extending downwardly from the first portion, the second portion having a second thermal response slower than the thermal response of the workpiece, further comprising elements removably mountable above the second portions of the pins, the elements having a third thermal response slower than the first thermal response.

6. The article as claimed in claim 5, wherein the removably mountable elements are slidable along the first portions of the pins.

* * * * *